United States Patent
Zhang et al.

(10) Patent No.: US 12,266,513 B2
(45) Date of Patent: Apr. 1, 2025

(54) DEVICE AND METHOD FOR SPUTTERING AND DEPOSITING METAL ON SURFACE OF MAGNETIC POWDER MATERIALS

(71) Applicant: Lanzhou Institute of Chemical Physics, CAS, Lanzhou (CN)

(72) Inventors: Bin Zhang, Lanzhou (CN); Ning Xia, Lanzhou (CN); Kaixiong Gao, Lanzhou (CN); Junyan Zhang, Lanzhou (CN); Zhongliang Chang, Lanzhou (CN); Yongping Bao, Lanzhou (CN); Haijun Jia, Lanzhou (CN)

(73) Assignee: Lanzhou Institute of Chemical Physics, CAS, Lanzhou (CN)

( * ) Notice: Subject to any disclaimer, the term of this patent is extended or adjusted under 35 U.S.C. 154(b) by 207 days.

(21) Appl. No.: 18/058,817

(22) Filed: Nov. 25, 2022

(65) Prior Publication Data

US 2023/0317429 A1 Oct. 5, 2023

(30) Foreign Application Priority Data

Jan. 5, 2022 (CN) .......................... 202210003729.9

(51) Int. Cl.
H01J 37/32 (2006.01)
C23C 14/35 (2006.01)
H01J 37/34 (2006.01)

(52) U.S. Cl.
CPC ........ *H01J 37/32715* (2013.01); *C23C 14/35* (2013.01); *H01J 37/32055* (2013.01); *H01J 37/32733* (2013.01); *H01J 37/32761* (2013.01); *H01J 37/32779* (2013.01); *H01J 37/3405* (2013.01); *H01J 37/3417* (2013.01); *H01J 37/32816* (2013.01); *H01J 2237/182* (2013.01); *H01J 2237/20214* (2013.01); *H01J 2237/335* (2013.01)

(58) Field of Classification Search
None
See application file for complete search history.

(56) References Cited

FOREIGN PATENT DOCUMENTS

| | | |
|---|---|---|
| CN | 202543309 U | 11/2012 |
| CN | 106521437 A | 3/2017 |
| CN | 111519156 A | 8/2020 |
| CN | 112210752 A | 1/2021 |
| CN | 213977862 U | 8/2021 |

OTHER PUBLICATIONS

Office Action in CN 202210003729.9, Jun. 30, 2022.

*Primary Examiner* — Jason Berman
(74) *Attorney, Agent, or Firm* — WCF IP

(57) ABSTRACT

A device and method for sputtering and depositing metal on the surface of magnetic powder materials utilizes a vacuum chamber, a vacuum pump set, a magnetron sputtering target, a cathode ion source, a water-cooled anode, and a sample holding component arranged in the vacuum chamber. The sample holding component is a sample roller, an axis of the sample roller is arranged in a horizontal direction, the sample roller can rotate around the axis thereof. Two ends of the sample roller are open, and the sample roller further comprises a power device capable of driving the sample roller to rotate. The cathode ion source and the magnetron sputtering target extend inwards into the sample roller from the opening in the same end of the sample roller. The water-cooled anode extends inwards into the sample roller from the opening in the other end of the sample roller.

17 Claims, 4 Drawing Sheets

DEVICE AND METHOD FOR SPUTTERING AND DEPOSITING METAL ON SURFACE OF MAGNETIC POWDER MATERIALS

CROSS-REFERENCE TO RELATED APPLICATION

This patent application claims the benefit and priority of Chinese Patent Application No. 202210003729.9, filed with the China National Intellectual Property Administration on Jan. 5, 2022, the disclosure of which is incorporated by reference herein in its entirety as part of the present application.

TECHNICAL FIELD

The present disclosure relates to the technical field of vacuum surface coating, and in particular relates to a device and method for sputtering and depositing metal on the surface of magnetic powder materials.

BACKGROUND

The coercive force stability of magnetic powder materials under special working conditions such as high temperature is generally improved by uniformly doping metal atoms inside the crystals and at the crystal boundaries.

At present, the process for uniform doping of the metal to the inside the crystals and at the crystal boundaries of the magnetic circuits is mainly done by mixing and ball-milling the magnetic material powder and doped powder, followed by high temperature tempering and diffusion to the inside of the crystals to form uniformly doped magnetic materials. However, the doped metal particles used in the method are dozens of nanometers to hundreds of nanometers, and it is hard to obtain uniformly doped magnetic materials during powder mixing and heat treatment. Meanwhile, impurities such as iron are introduced by ball milling, affecting the obtaining of high-performance magnetic materials.

Vacuum coating technique is generally adopted to deposit metal on the surface of the magnetic powder materials, by which sub-nanoscale coatings can be obtained, with uniformly wrapped on magnetic powder materials over a large area. Therefore, uniformly deposited doped coatings can be obtained on the surface of the magnetic materials by using vacuum coating, and then annealing treatment is conducted to obtain the magnetic materials with uniformly distributed doped atoms.

At present, in the prior art, the vacuum coating technique is generally adopted to deposit metal on the surface of the magnetic powder material, mainly including: vacuum evaporation deposition, vacuum sputtering deposition, vacuum ion deposition, vacuum winding and continuous deposition, chemical vapor deposition, ion implantation, ion-assisted deposition, etc. However, it is difficult to obtain uniform doping on the surface of magnetic powder material by the above commonly used vacuum coating techniques. This is due to the uneven deposition on each surface of the magnetic powder material caused by the large size of the magnetic powder material (micron-sized); or the uneven deposition caused by the agglomeration and accumulation of the magnetic powder material in the mixing process. Therefore, the preparation of homogeneous doped magnetic powder materials is a challenging subject.

In Chinese patent CN201610963465.6, a powder particle vibration type magnetron sputtering coating method is provided, comprising the following steps: placing powder samples on a vibration plate, and overturning the powder samples by vibration to achieve full-surface coating of the powder. In Chinese patent CN202010541309.7, a method for preparing coated composite powder for thermal spraying by vacuum magnetron sputtering is provided, comprising the following steps: firstly, placing the powder on a coating platform, and then performing deposition coating on the particles by means of vibration. In accordance with the above two patents, a vibration component is arranged in a deposition device, the uniformity of surface deposition of the metal material is achieved by vibrating the magnetic powder material during deposition, but the high deposition uniformity on the surface of the magnetic powder material cannot be achieved. Moreover, due to the limitation of the vibration component, it is difficult to achieve metal deposition for the kilogram-level magnetic powder material.

SUMMARY

To this end, the present disclosure provides a device and method for sputtering and depositing metal on the surface of a magnetic powder material. The device provided by the present disclosure can achieve high uniform deposition on the surface of the magnetic powder material and is large in single treatment capacity.

To achieve the objective of the present disclosure above, the present disclosure provides the following technical solution:

The present disclosure provides a device for sputtering and depositing metal on the surface of a magnetic powder material. The device comprises a vacuum chamber 1, a vacuum pump set 4, a magnetron sputtering target 5, a cathode ion source 6, a water-cooled anode 7, and a sample holding component arranged in the vacuum chamber. The sample holding component is a sample roller 2, an axis of the sample roller 2 is arranged in a horizontal direction, and the sample roller 2 can rotate around the axis thereof. The two ends of the sample roller 2 are open, and the sample roller further comprises a power device 8 capable of driving the sample roller to rotate.

The cathode ion source 6 and the magnetron sputtering target 5 extend inwards into the sample roller 2 from an opening in the same end of the sample roller 2.

The water-cooled anode 7 extends inwards into the sample roller 2 from an opening in the other end of the sample roller 2.

Preferably, the magnetron sputtering target 5 is provided with a built-in magnetic field. The built-in magnetic field comprises a magnetron sputtering annular magnetic field and an auxiliary magnetic field, and the auxiliary magnetic field is a magnetic field which is opposite to a racetrack direction of the magnetron sputtering annular magnetic field and is in the same direction as the magnetron sputtering annular magnetic field.

Preferably, an inner wall of the sample roller 2 is provided with a plurality of shield-shaped protrusions.

The present disclosure provides a method for sputtering and depositing metal on the surface of a magnetic powder material, comprising the following steps:

after loading the magnetic powder material into a sample roller 2 of the device according to any one of claims 1 to 3, vacuumizing a vacuum chamber 1;

keeping the rotation process of the sample roller 2;

after introducing inertia gas into the vacuum chamber 1, cleaning the magnetic powder material by using an arc plasma column formed by a cathode ion source 6 and a supported water-cooled anode 7 to obtain the surface-purified magnetic powder material in the sample roller 2; and carrying out, by using the magnetron sputtering target 5, magnetron sputtering on the rotating purified magnetic powder material for metal deposition.

The magnetic powder material reciprocates along the inner circumferential surface of the sample roller 2 along with the rotation of the sample roller 2, and the maximum circle center of the reciprocating motion of the magnetic powder is less than 90°.

Preferably, the rotation speed of the sample roller 2 is 3 r/min to 5 r/min.

Preferably, the magnetron sputtering target 5 is powered by a high-power group-wave pulse power supply; a pulse frequency of the high-power group-wave pulse power supply is 500 Hz to 20,000 Hz, and a current of the high-power group-wave pulse power supply is 300 A to 1,200 A.

Preferably, the high-power group-wave pulse power supply outputs a positive pulse bias voltage and a negative pulse bias voltage, and absolute values of the positive pulse bias voltage and the negative pulse bias voltage are 0 V to 1,200 V, independently.

Preferably, the sample roller 2 is powered by a negative pulse bias power supply; a voltage of the negative pulse bias power supply is −1,200 V to 0 V and a pulse frequency of the negative pulse bias power supply is 500 Hz to 20,000 Hz; one positive pulse is output after each bias voltage negative pulse of the negative pulse bias power supply, and a voltage of the positive pulse is 0 V to 100 V.

Preferably, the cathode ion source 6 and the supported water-cooled anode 7 are powered by a modulation power supply; the modulation power supply comprises a pulse arc power supply and a positive pulse bias power supply, the cathode ion source 6 is electrically connected to the pulse arc power supply, and the water-cooled anode 7 is electrically connected to the positive pulse bias power supply.

A frequency of the positive pulse bias power supply is the same as that of the pulse arc power supply.

Preferably, a pulse frequency of each of the pulse arc power supply and the positive pulse bias power supply is 500 Hz to 20,000 Hz, and a current of each of the pulse arc power supply and the positive pulse bias power supply is 300 A to 1200 A.

The device for sputtering and depositing metal on the surface of a magnetic powder material provided by the present disclosure comprises a vacuum chamber 1, a vacuum pump set 4, a magnetron sputtering target 5, a cathode ion source 6, a water-cooled anode 7, and a sample holding component arranged in the vacuum chamber. The sample holding component is a sample roller 2, an axis of the sample roller 2 is arranged in a horizontal direction, and the sample roller 2 can rotate around the axis thereof. The two ends of the sample roller 2 are open, and the sample roller further comprises a power device 8 capable of driving the sample roller to rotate. The cathode ion source 6 and the magnetron sputtering target 5 extend inwards into the sample roller 2 from an opening in the same end of the sample roller 2. The water-cooled anode 7 extends inwards into the sample roller 2 from an opening in the other end of the sample roller 2. In accordance with the device provided by the present disclosure, the magnetic powder material in the sample roller 2 is driven by means of the rotation of the sample roller 2 around the horizontal axis to move back and forth along the circumferential surface of the sample roller 2 on an arc with the central angle of less than 90°. The horizontal position change of the magnetic powder material in a magnetic field of magnetron sputtering is achieved during the back-and-forth movement, and meanwhile, the magnetic powder material is continuously overturned in the ascending and descending process along with the sample roller 2, the metal deposition is conducted on the magnetic powder material in cooperation with the magnetron sputtering target 5 deep in the sample roller 2. Therefore, the high uniform deposition on the surface of the magnetic powder material can be achieved, and the structural design of the sample roller 2 can obviously increase the single treatment capacity, improve the treatment efficiency and is suitable for industrial product.

Figure 1:
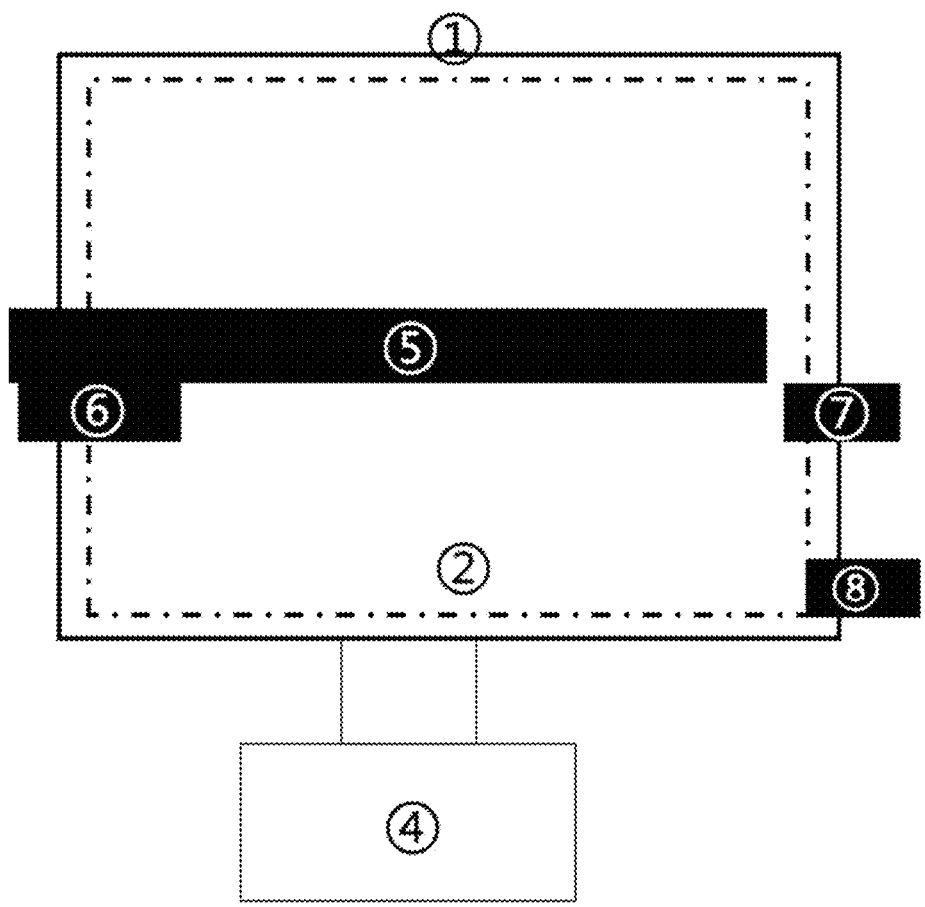
FIG. 1 is a side view of a device for sputtering and depositing metal on the surface of a magnetic powder material in accordance with an embodiment of the present disclosure.
Figure 2:
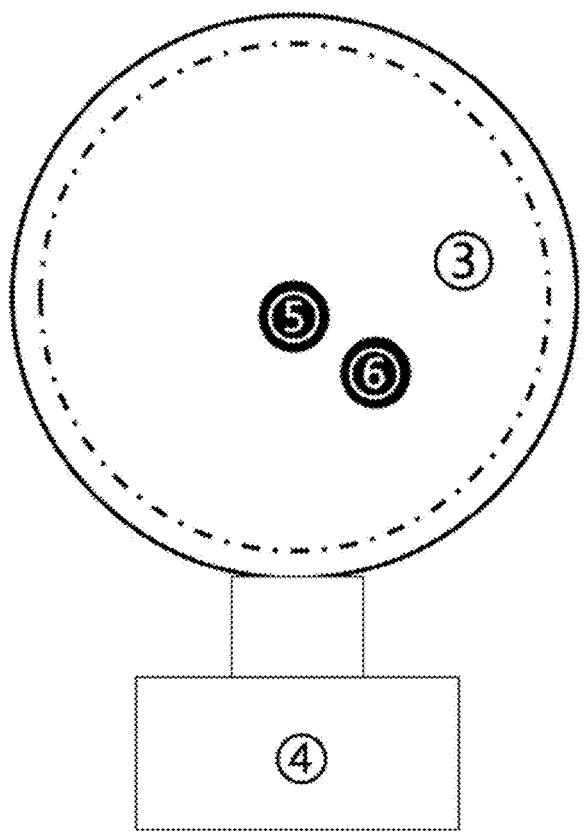
FIG. 2 is a front view of a device for sputtering and depositing metal on the surface of a magnetic powder material in accordance with an embodiment of the present disclosure.
Figure 3:
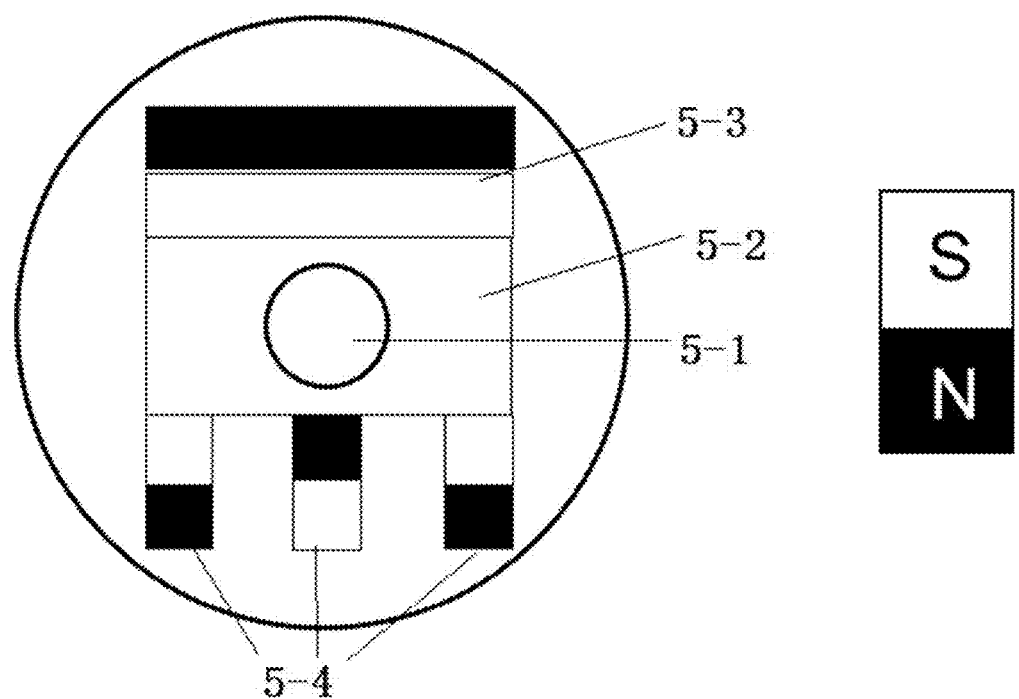
FIG. 3 is a surface chart of a magnetron sputtering target 5 of a device for sputtering and depositing metal on the surface of a magnetic powder material in accordance with an embodiment of the present disclosure.
Figure 4:
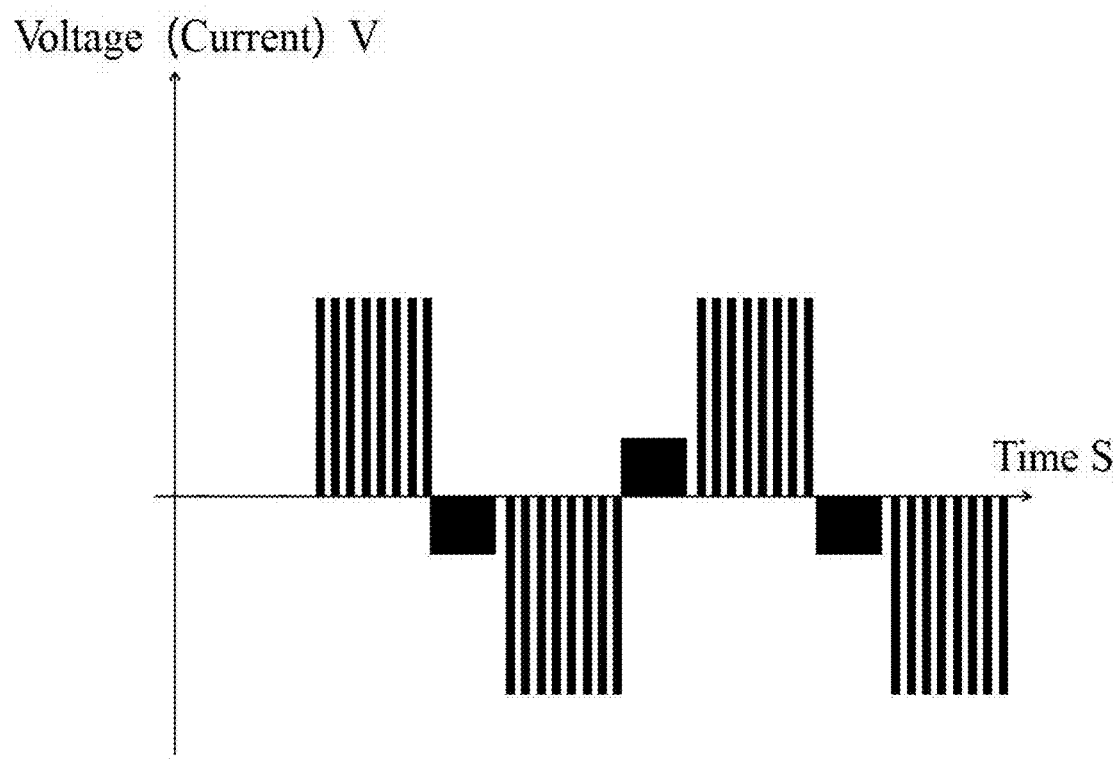
FIG. 4 is a diagram illustrating the waveform output by a high-power group-wave pulse power supply electrically connected to a magnetron sputtering target 5 during magnetron sputtering deposition.
Figure 5:
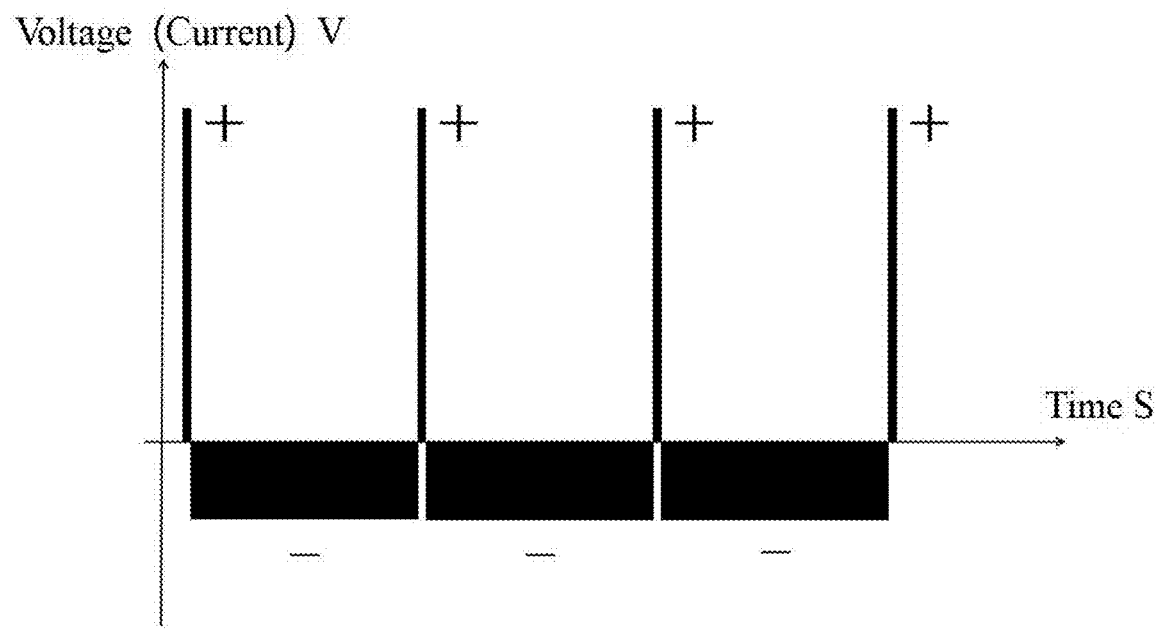
FIG. 5 is a diagram illustrating the waveform output by a negative pulse bias power supply electrically connected to a sample roller 2 during magnetron sputtering deposition.
Figure 6:
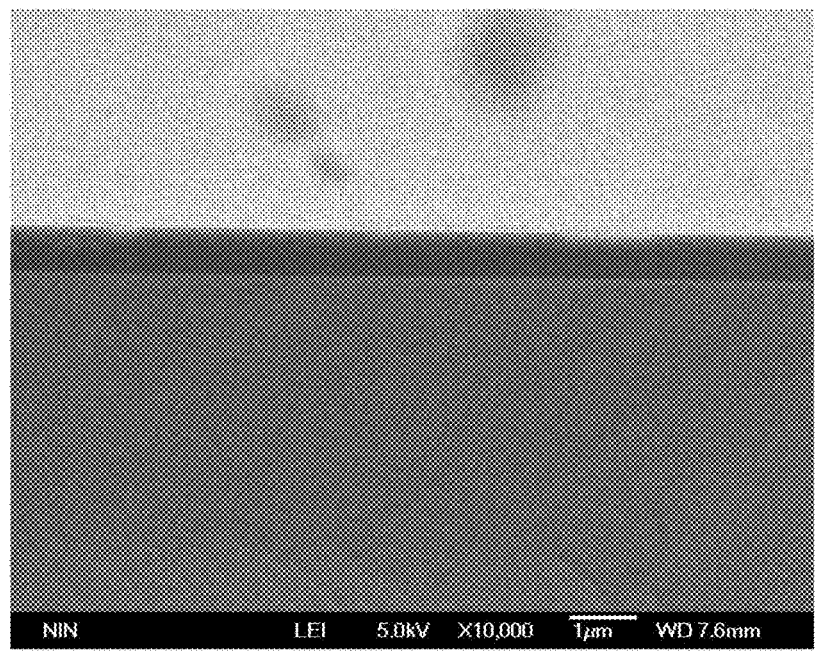

1-vacuum chamber; 2-sample holding component; 3-first vacuum chamber door; 4-vacuum pump set; 5-magnetron sputtering target; 6-cathode ion source; 7-water-cooled anode; 8-power device; 5-1-cooling water pipe; 5-2-metal target core; 5-3-second magnet; 5-4-first magnet;

FIG. 6 is an electron microscopic image after metal deposition by the method in accordance with an embodiment I of the present disclosure.

DETAILED DESCRIPTION OF THE EMBODIMENTS

The present disclosure provides a device for sputtering and depositing metal on the surface of a magnetic powder material. The device comprises a vacuum chamber 1, a vacuum pump set 4, a magnetron sputtering target 5, a cathode ion source 6, a water-cooled anode 7, and a sample holding component arranged in the vacuum chamber. The sample holding component is a sample roller 2, an axis of the sample roller 2 is arranged in a horizontal direction, and the sample roller 2 can rotate around the axis thereof. The two ends of the sample roller 2 are open, and the sample roller further comprises a power device 8 capable of driving the sample roller to rotate.

The cathode ion source 6 and the magnetron sputtering target 5 extend inwards into the sample roller 2 from an opening in the same end of the sample roller 2.

The water-cooled anode 7 extends inwards into the sample roller 2 from an opening in the other end of the sample roller 2.

The device provided by the present disclosure comprises a vacuum chamber 1.

As a specific embodiment of the present disclosure, the vacuum chamber 1 is provided with a first vacuum chamber door and a second vacuum chamber door. The first vacuum chamber door 3 and the second vacuum chamber door correspond to the two open ends of the sample roller 2.

As a specific embodiment of the present disclosure, the first vacuum chamber door 3 and the second vacuum chamber door are clam-type side-opening doors.

As a specific embodiment of the present disclosure, the dimension of the vacuum chamber 1 is φ600 m×800 mm.

The device provided by the present disclosure comprises a vacuum pump set 4. The vacuum pump set 4 communicates with the vacuum chamber 1, and the vacuum pump set 4 is configured to vacuumize the vacuum chamber 1.

As a specific embodiment of the present disclosure, the vacuum pump set 4 employs a FF250-2000 molecular pump and a 18 L/min mechanical pump, thus satisfying that the vacuum chamber can be vacuumized to $2 \times 10^{-3}$ Pa within 40 min.

The device provided by the present disclosure comprises a magnetron sputtering target 5, and the magnetron sputtering target 5 extends inwards into the sample roller 2 from the opening in the same end of the sample roller 2.

As a specific embodiment of the present disclosure, the magnetron sputtering target 5 is arranged on an inner wall of the first vacuum chamber door 3 or the second vacuum door of the vacuum chamber.

As a specific embodiment of the present disclosure, the magnetron sputtering target 5 is provided with a built-in magnetic field, the built-in magnetic field comprises a magnetron sputtering annular magnetic field and an auxiliary magnetic field, and the auxiliary magnetic field is a magnetic field which is opposite to a racetrack direction of the magnetron sputtering annular magnetic field and is in the same direction as the magnetron sputtering annular magnetic field.

As a specific embodiment of the present disclosure, the magnetron sputtering target 5 comprises a cooling water pipe 5-1 along a length direction of the magnetron sputtering target 5; a metal target core 5-2 arranged on the outer circumference of the cooling water pipe 5-1; a plurality of first magnets 5-4 arranged below the metal target core 5-2, wherein the plurality of first magnets 5-4 form the magnetron sputtering annular magnetic field; and a second magnet 5-3 arranged above the metal target core 5-2, wherein the second magnet 5-3 forms the auxiliary magnetic field.

As a specific embodiment of the present disclosure, the magnetron sputtering target 5 is electrically coupled to a high-power group-wave pulse power supply.

As a specific embodiment of the present disclosure, the magnetron sputtering target 5 is a columnar target.

As a specific embodiment of the present disclosure, the dimension of the vacuum chamber 5 is φ100 mm×660 mm.

As a specific embodiment of the present disclosure, the magnetron sputtering target 5 is a magnetron sputtering dysprosium target.

The device provided by the present disclosure comprises a cathode ion source 6. The cathode ion source 6 and the magnetron sputtering target 5 extend inwards into the sample roller 2 from the opening in the same end of the sample roller 2.

As a specific embodiment of the present disclosure, the cathode ion source 6 is a lanthanum hexaboride hollow cathode ion source.

As a specific embodiment of the present disclosure, the cathode ion source 6 is arranged on the inner wall of the first vacuum chamber door 3 or the second vacuum door of the vacuum chamber.

As a specific embodiment of the present disclosure, the cathode ion source 6 and the magnetron sputtering target 5 are arranged on the inner wall of the same vacuum chamber door of the vacuum chamber 1.

The device provided by the present disclosure comprises a water-cooled anode 7. The cathode ion source 6 and the magnetron sputtering target 5 extend inwards into the sample roller 2 from the opening in the same end of the sample roller 2.

As a specific embodiment of the present disclosure, the water-cooled anode 7 is arranged on the inner wall of the first vacuum chamber door 3 or the second vacuum door of the vacuum chamber. The cathode ion source 6 and the water-cooled anode 7 are not arranged on the inner wall of the same vacuum chamber door 1 at the same time.

As a specific embodiment of the present disclosure, the cathode ion source 6 and the water-cooled anode 7 are powered by a modulation power supply. The modulation power supply comprises a pulse arc power supply and a positive pulse bias power supply, the cathode ion source 6 is electrically connected to the pulse arc power supply, and the water-cooled anode 7 is electrically connected to the positive pulse bias power supply.

The device provided by the present disclosure comprises a sample holding component arranged in the vacuum chamber. The sample holding component is a sample roller 2, the sample roller 2 can rotate around a horizontal axis thereof. The two ends of the sample roller 2 are open.

As a specific embodiment of the present disclosure, an inner wall of the sample roller 2 is provided with a plurality of shield-shaped protrusions.

As a specific embodiment of the present disclosure, the sample roller 2 is electrically coupled to a negative pulse bias power supply.

The device provided by the present disclosure further comprises a power device 8 electrically connected to the sample roller 2.

The present disclosure provides a method for sputtering and depositing metal on the surface of a magnetic powder material, comprising the following steps:

After the magnetic powder material is loaded into a sample roller 2 of the device of above technical solution, a vacuum chamber 1 is vacuumized.

The rotation process of the sample roller 2 is kept.

After inertia gas is introduced into the vacuum chamber 1, the magnetic powder material is cleaned by using a cathode ion source 6 and a supported water-cooled anode 7 to obtain the purified magnetic powder material.

The magnetron sputtering is conducted, by using the magnetron sputtering target 5, on the rotating purified magnetic powder material for metal deposition.

The magnetic powder material reciprocates along the circumferential surface of the sample roller 2 along with the rotation of the sample roller 2, and the maximum circle center of the reciprocating motion of the magnetic powder is less than 90°.

After the magnetic powder is loaded into the sample roller 2 of the device of above technical solution, the vacuum chamber 1 is vacuumized.

In the present disclosure, the particle size of the magnetic powder is micron-sized.

In the present disclosure, the magnetic powder is preferably a magnetic powder sheet, and when the magnetic powder is preferably the magnetic powder sheet, the size of the magnetic powder sheet is 20 mm to 30 mm.

In the present disclosure, after being vacuumized, the vacuum chamber 1 has a vacuum degree of $1\times10^{-3}$ to $5\times10^{-3}$ Pa, more preferably $2\times10^{-3}$ Pa.

The rotation process of the sample roller 2 is kept. After the inertia gas is introduced into the vacuum chamber 1, the magnetic powder material is cleaned by using the cathode ion source 6 and the supported water-cooled anode 7 to obtain the purified magnetic powder material in the sample roller 2.

In the present disclosure, the inertia gas is preferably Ar.

In the present disclosure, after the Ar is introduced, the pressure in the vacuum chamber 1 is preferably 0.5 Pa.

In the present disclosure, the rotation speed of the sample roller 2 is preferably 3 r/min to 5 r/min, more preferably 3.5 r/min to 4 r/min.

In the present disclosure, during cleaning, the cathode ion source 6 and the supported water-cooled anode 7 are powered by a modulation power supply. The modulation power supply comprises a pulse arc power supply and a positive pulse bias power supply, the cathode ion source 6 is electrically connected to the pulse arc power supply, and the water-cooled anode 7 is electrically connected to the positive pulse bias power supply. A frequency of the positive pulse bias power supply is the same as that of the pulse arc power supply.

In the present disclosure, during cleaning, a pulse frequency of the pulse arc power supply is preferably 500 Hz to 20,000 Hz, more preferably 800 Hz to 10,000 Hz.

In the present disclosure, during cleaning, a current of the pulse arc power supply is preferably 300 A to 1,200 A, more preferably 350 A to 1,000 A.

In the present disclosure, during cleaning, a current of the positive pulse bias power supply is preferably 300 A to 1,200 A, more preferably 350 A to 1,000 A.

In the present disclosure, during cleaning, the sample roller 2 is powered by a negative pulse bias power supply, and an electric field is applied, by the negative pulse bias power supply, to the magnetic powder.

In the present disclosure, during cleaning, a negative bias voltage applied to the magnetic powder is preferably −1,200 V to 0 V, more preferably −800 V. The pulse frequency is preferably 500 Hz to 20,000 Hz, more preferably 1,000 Hz.

In the present disclosure, during cleaning, the voltage applied to the magnetic powder by the bias power supply is preferably −800 A, the pulse frequency is 1,000 Hz.

In the present disclosure, the inertia gas in the vacuum chamber 1 forms inertia gas ions under discharge excitation of the pulse arc power supply, and the inert gas bombards the magnetic powder to clean the magnetic powder.

In the present disclosure, the cleaning time is preferably 15 min to 30 min, more preferably 20 min.

In the present disclosure, the modulation power supply for the cathode ion source 6 and the supported water-cooled anode 7 is turned off after cleaning.

After obtaining the purified magnetic powder material, the magnetron sputtering target 5 is configured to perform magnetron sputtering on the rotating purified magnetic powder material for metal deposition.

The magnetic powder material reciprocates along the circumferential surface of the sample roller 2 along with the rotation of the sample roller 2, and the maximum circle center of the reciprocating motion of the magnetic powder is less than 90°.

In the present disclosure, during magnetron sputtering, the magnetron sputtering target 5 is preferably powered by a high-power group-wave pulse power supply. A pulse frequency of the high-power group-wave pulse power supply is preferably 500 Hz to 20,000 Hz, more preferably 800 Hz to 10,000 Hz; and a current of the high-power group-wave pulse power supply is preferably 300 A to 1,200 A, more preferably 350 A to 1,000 A.

In the present disclosure, during magnetron sputtering, the high-power group-wave pulse power supply outputs a positive pulse bias voltage and a negative pulse bias voltage. Absolute values of the positive pulse bias voltage and the negative pulse bias voltage are preferably 0 V to 1,200 V, independently, more preferably 45 V to 1,000 V.

In the present disclosure, during magnetron sputtering, the pulse duty cycle of the high-power group-wave pulse power supply is preferably less than 50%, more preferably 35%.

In the present disclosure, during magnetron sputtering, the sample roller 2 is preferably powered by the negative pulse bias power supply. A voltage of the negative pulse bias power supply is preferably −1,200 V to 0 V, a pulse frequency of the negative pulse bias power supply is preferably 500 Hz to 20,000 Hz. One positive pulse is output after each bias voltage negative pulse of the negative pulse bias power supply, and a voltage of the positive pulse is preferably 0 V to 100 V.

In the present disclosure, the time for magnetron sputtering is 4 h.

In the present disclosure, the deposited metal is preferably deposited dysprosium metal, specifically.

In the present disclosure, the magnetic powder material reciprocates along the circumferential surface of the sample roller 2 along with the rotation of the sample roller 2, and the maximum circle center of the reciprocating motion of the magnetic powder is less than or equal to 60°.

The technical solution of the present disclosure is described clearly and completely below with reference to the embodiments of the present disclosure. Apparently, the described embodiments are only part rather than all of the embodiments of the present disclosure. On the basis of the embodiments of the present disclosure, all other embodiments acquired by those of ordinary skill in the art without making inventive efforts fall within the scope of protection of the present disclosure.

Embodiment 1

The embodiment provides a device for sputtering and depositing metal on the surface of a magnetic powder material. The device comprises a cylindrical vacuum chamber 1, the dimension of the vacuum chamber 1 is φ600 m×800 mm. The vacuum chamber 1 is provided with a first vacuum chamber door and a second vacuum chamber door. The first vacuum chamber door 3 and the second vacuum chamber door correspond to the two open ends of a sample roller 2, and the first vacuum chamber door 3 and the second vacuum chamber door are clam-type side opening doors. The device comprises a vacuum set pump 4. The vacuum set pump 4 employs a FF250-2000 molecular pump and 18 L/min mechanical pump, thus satisfying that the vacuum chamber can be vacuumized to $2\times10^{-3}$ Pa within 40 min. The device comprises a magnetron sputtering target 5. The magnetron sputtering target 5 deeps inwards into the sample roller 2 and is arranged on an inner wall of the first vacuum chamber door 3 of the vacuum chamber. The magnetron sputtering target 5 is provided with a built-in magnetic field, the built-in magnetic field comprises a magnetron sputtering annular magnetic field and an auxiliary magnetic field, and the auxiliary magnetic field is a magnetic field which is opposite to a racetrack direction of the magnetron sputtering annular magnetic field and is in the same direction as the magnetron sputtering annular magnetic field. The magnetron sputtering target 5 is electrically coupled to a high-power group-wave pulse power supply, and the magnetron sputtering target 5 is a columnar target and is a dysprosium target having the dimension of φ100 mm×660 mm. The device further comprises a lanthanum hexaboride hollow cathode ion source 6, the lanthanum hexaboride hollow cathode ion source 6 deeps inwards into the sample roller 2, and the lanthanum hexaboride hollow cathode ion source 6 is arranged on the inner wall of the first vacuum chamber door 3 of the vacuum chamber. The device comprises a water-cooled anode 7, the water-cooled anode 7 deeps inwards into the sample roller 2, and the water-cooled anode 7 is arranged on an inner wall of the second vacuum chamber door. The lanthanum hexaboride hollow cathode ion source 6 and the water-cooled anode 7 are electrically connected to a modulation power supply, and the modulation power supply comprises a pulse arc power supply and a positive pulse bias power supply. The lanthanum hexaboride hollow cathode ion source 6 is electrically connected to the pulse arc power supply, and the water-cooled anode 7 is electrically connected to the positive pulse bias power supply. The device comprises the sample roller 2, the sample roller 2 can rotate along a horizontal axis, the two ends of the sample roller 2 are open, a plurality of shield-shaped protrusions are arranged on the inner wall of the sample roller 2, and the sample roller 2 is electrically coupled to a negative pulse bias power supply. The device further comprises a power device 8 electrically connected to the sample roller 2.

The magnetic powder is loaded into the sample roller 2 and then is transferred into the vacuum chamber 1, and the vacuum chamber is vacuumized to 2×10$^{-3}$ Pa. The rotation speed of the sample roller 2 is set to be 3 r/min to 5 r/min. The argon is filled into the main vacuum chamber 1 until the pressure is 0.5 Pa. The pulse arc power supply electrically connected to the ion source 6 and the positive pulse bias power supply electrically connected to the water-cooled anode 7 are turned on, a current of each of the pulse arc power supply and the positive pulse bias power supply is 400 A, a positive bias voltage of the positive pulse bias power supply is +300 V, and a frequency of each of the pulse arc power supply and the positive pulse bias power supply is 1,000 Hz. The negative pulse bias power supply electrically connected to the sample roller 2 is turned on, a negative bias voltage applied to the magnetic powder is −800 V, and the pulse frequency is 1,000 Hz. After argon ion bombardment cleaning is conducted for 20 min, the pulse arc power supply and the positive pulse bias power supply are turned off, the negative bias voltage of the negative pulse bias power supply electrically connected to the sample roller 2 is adjusted to −50 V, the pulse frequency is 1,000 Hz. One positive pulse is output after each bias voltage negative pulse, with a positive bias voltage of 10 V. The high-power group-wave pulse power supply for the magnetron sputtering dysprosium target 5 is turned on for deposition for 4 hours at the current of 400 A, the frequency of 1000 Hz and the pulse duty ratio of 35%.

The system is then turned off, the nitrogen is introduced until the temperature in the vacuum chamber 1 is reduced to 50° C. Then the air is filled, the main vacuum chamber 1 is opened to take out the deposited sample piece. The electron microscopic photograph of the deposited metal layer is shown in FIG. 6 after the deposited sample piece is inspected to be silvery white by naked eyes. It can be obtained from the FIG. 6 that the high-speed uniform deposition on the surface of the magnetic powder material can be achieved, the treatment efficiency is improved, and the device is suitable for industrial production.

The foregoing is merely preferred embodiments of the present disclosure, and it should be noted that several improvements and modifications may be made to those skilled in the art without departing from the principles of the present disclosure, which are also considered to be within the scope of the present disclosure.

What is claimed is:

1. A method for sputtering and depositing metal on a surface of magnetic powder materials, comprising the following steps:

after loading a magnetic powder material into a sample roller of a device for sputtering and depositing metal on the surface of magnetic powder materials, vacuumizing a vacuum chamber;

wherein the device further comprises a vacuum chamber, a vacuum pump set, a magnetron sputtering target, a cathode ion source, and a water-cooled anode, and wherein the sample roller is arranged in the vacuum chamber, an axis of the sample roller is arranged in a horizontal direction, and the sample roller is able to rotate around the axis, wherein the sample roller has two ends both of which are open, and the sample roller comprises a power device capable of driving the sample roller to rotate, wherein the cathode ion source and the magnetron sputtering target each extend inwards into the sample roller from a first opening in a first of the two ends of the sample roller, and wherein the water-cooled anode extends inwards into the sample roller from a second the opening in a second end of the two ends of the sample roller;

keeping the sample roller rotating;

after introducing inertia gas into the vacuum chamber, cleaning the magnetic powder material by using an arc plasma column formed by a cathode ion source and a supported water-cooled anode to obtain the surface-purified magnetic powder material in the sample roller; and carrying out, by using the magnetron sputtering target, magnetron sputtering on the rotating purified magnetic powder material for metal deposition;

wherein the magnetic powder material reciprocates along the inner circumferential surface of the sample roller along with the rotation of the sample roller, and the maximum circle center of the reciprocating motion of the magnetic powder is less than 90°.

2. The method according to claim 1, wherein the magnetron sputtering target is provided with a built-in magnetic field, the built-in magnetic field comprises a magnetron sputtering annular magnetic field and an auxiliary magnetic field, and the auxiliary magnetic field is a magnetic field which is opposite to a racetrack direction of the magnetron sputtering annular magnetic field and is in the same direction as the magnetron sputtering annular magnetic field.

3. The method according to claim 1, wherein an inner wall of the sample roller is provided with a plurality of shield-shaped protrusions.

4. The method according to claim 1, wherein the rotation speed of the sample roller is 3 r/min to 5 r/min.

5. The method according to claim 2, wherein the rotation speed of the sample roller is 3 r/min to 5 r/min.

6. The method according to claim 3, wherein the rotation speed of the sample roller is 3 r/min to 5 r/min.

7. The method according to claim 1, wherein the magnetron sputtering target is powered by a high-power group-wave pulse power supply; a pulse frequency of the high-power group-wave pulse power supply is 500 Hz to 20,000 Hz, and a current of the high-power group-wave pulse power supply is 300 A to 1,200 A.

8. The method according to claim 2, wherein the magnetron sputtering target is powered by a high-power group-wave pulse power supply; a pulse frequency of the high-power group-wave pulse power supply is 500 Hz to 20,000 Hz, and a current of the high-power group-wave pulse power supply is 300 A to 1,200 A.

9. The method according to claim 3, wherein the magnetron sputtering target is powered by a high-power group-wave pulse power supply; a pulse frequency of the high-power group-wave pulse power supply is 500 Hz to 20,000 Hz, and a current of the high-power group-wave pulse power supply is 300 A to 1,200 A.

10. The method according to claim 7, wherein the high-power group-wave pulse power supply outputs a positive pulse bias voltage and a negative pulse bias voltage, and absolute values of the positive pulse bias voltage and the negative pulse bias voltage are 0 V to 1,200 V, independently.

11. The method according to claim 8, wherein the high-power group-wave pulse power supply outputs a positive pulse bias voltage and a negative pulse bias voltage, and absolute values of the positive pulse bias voltage and the negative pulse bias voltage are 0 V to 1,200 V, independently.

12. The method according to claim 9, wherein the high-power group-wave pulse power supply outputs a positive pulse bias voltage and a negative pulse bias voltage, and absolute values of the positive pulse bias voltage and the negative pulse bias voltage are 0 V to 1,200 V, independently.

13. The method according to claim 1, wherein the sample roller is powered by a negative pulse bias power supply; a voltage of the negative pulse bias power supply is −1,200 V to 0 V and a pulse frequency of the negative pulse bias power supply is 500 Hz to 20,000 Hz; one positive pulse is output after each bias voltage negative pulse of the negative pulse bias power supply, and a voltage of the positive pulse is 0 V to 100 V.

14. The method according to claim 2, wherein the sample roller is powered by a negative pulse bias power supply; a voltage of the negative pulse bias power supply is −1,200 V to 0 V and a pulse frequency of the negative pulse bias power supply is 500 Hz to 20,000 Hz; one positive pulse is output after each bias voltage negative pulse of the negative pulse bias power supply, and a voltage of the positive pulse is 0 V to 100 V.

15. The method according to claim 3, wherein the sample roller is powered by a negative pulse bias power supply; a voltage of the negative pulse bias power supply is −1,200 V to 0 V and a pulse frequency of the negative pulse bias power supply is 500 Hz to 20,000 Hz; one positive pulse is output after each bias voltage negative pulse of the negative pulse bias power supply, and a voltage of the positive pulse is 0 V to 100 V.

16. The method according to claim 1, wherein
the cathode ion source and the water-cooled anode are powered by a modulation power supply;
the modulation power supply comprises a pulse arc power supply and a positive pulse bias power supply, the cathode ion source is electrically connected to the pulse arc power supply, and the water-cooled anode is electrically connected to the positive pulse bias power supply; and
a frequency of the positive pulse bias power supply is the same as that of the pulse arc power supply.

17. The method according to claim 16, wherein a pulse frequency of each of the pulse arc power supply and the positive pulse bias power supply is 500 Hz to 20,000 Hz, and a current of each of the pulse arc power supply and the positive pulse bias power supply is 300 A to 1200 A.

* * * * *